United States Patent
Zhang (10) Patent No.: US 12,027,443 B2
(45) Date of Patent: Jul. 2, 2024

(54) INTEGRATED COOLING DEVICE BASED ON PELTIER EFFECT AND MANUFACTURING METHOD THEREOF

(71) Applicant: MONTAGE TECHNOLOGY CO., LTD., Shanghai (CN)

(72) Inventor: Xiong Zhang, Shanghai (CN)

(73) Assignee: MONTAGE TECHNOLOGY CO., LTD., Shanghai (CN)

( * ) Notice: Subject to any disclaimer, the term of this patent is extended or adjusted under 35 U.S.C. 154(b) by 0 days.

(21) Appl. No.: 17/836,481

(22) Filed: Jun. 9, 2022

(65) Prior Publication Data
US 2022/0399248 A1    Dec. 15, 2022

(30) Foreign Application Priority Data
Jun. 9, 2021 (CN) .......................... 202110644412.9

(51) Int. Cl.
*H01L 23/38* (2006.01)
*H10N 10/01* (2023.01)
*H10N 10/17* (2023.01)

(52) U.S. Cl.
CPC .............. *H01L 23/38* (2013.01); *H10N 10/01* (2023.02); *H10N 10/17* (2023.02)

(58) Field of Classification Search
None
See application file for complete search history.

(56) References Cited

U.S. PATENT DOCUMENTS

| 6,333,557 B1* | 12/2001 | Sullivan | H01L 23/3677 257/E23.105 |
| 9,773,717 B1 | 9/2017 | Koswatta et al. | |
| 10,991,667 B2* | 4/2021 | Huang | H01L 24/03 |
| 2013/0140671 A1* | 6/2013 | Takatani | H01L 23/5386 257/737 |
| 2013/0187252 A1* | 7/2013 | Edwards | H01L 23/38 257/467 |

* cited by examiner

*Primary Examiner* — Tamir Ayad
(74) *Attorney, Agent, or Firm* — Oliff PLC (57) ABSTRACT

Integrated cooling device based on Peltier effect and manufacturing method thereof are provided. The device comprises one or more first heat dissipation structures around a device area. Each first heat dissipation structure comprises first N-type deep doped regions and first P-type deep doped regions arranged alternately, first vias, and first metal interconnection layers. The first vias are respectively located on two ends of each first N-type and each first P-type deep doped region. The first metal interconnect layers connect the first vias and such that the first heat dissipation structures are connected as a first S-shaped structure. When the first S-shaped structure is turned on, heat in the first N-type deep doped regions and the first P-type deep doped regions flows from a side close to the device area to its other side away from the device area, so as to realize heat dissipation in the device area.

8 Claims, 5 Drawing Sheets

Figure 9

INTEGRATED COOLING DEVICE BASED ON PELTIER EFFECT AND MANUFACTURING METHOD THEREOF

TECHNICAL FIELD

This disclosure generally relates to the technical field of semiconductor, in particular to an integrated cooling device based on the Peltier effect and a manufacturing method thereof.

BACKGROUND

Chips are called as "food" of modern industry, and are important basic components of information technology industry. The development of mobile phones, computer vehicles, industrial control, Internet of Things, big data, artificial intelligence and other fields is inseparable from chips. In addition to working according to designed functions, the chips will inevitably generate heat. It is important to ensure the safety and reliability of products to dissipate the heat efficiently to keep internal devices of the chips working at a safe temperature. With the increase of chip scale and speed, it is becoming more and more challenging, and innovative ideas and methods need to be introduced.

Peltier effect refers to a phenomenon of heat absorption and heat release at joints of different conductors when current flows through a loop composed of different conductors. Existing designs based on metal Peltier effect, usually have a weak cooling effect and are incompatible with existing semiconductor CMOS processes, which also requires an additional cooling mode and brings inconvenience to the application. Therefore, there is a need to provide a cooling device based on the Peltier effect to achieve better process compatibility and cooling effect.

SUMMARY OF THE INVENTION

An object of the present invention is to provide an integrated cooling device based on the Peltier effect and a manufacturing method thereof, which can be compatible with the existing CMOS processes and improve the heat dissipation effect when applied to chip circuits.

In one aspect of the present application, an integrated cooling device based on the Peltier effect is provided, the device comprises:
  one or more first heat dissipation structures around a device area, and the first heat dissipation structure comprises:
    multiple first N-type deep doped regions and multiple first P-type deep doped regions arranged alternately;
    multiple first vias on both ends of each of the first N-type deep doped regions and each of the first P-type deep doped regions;
    first metal interconnect layers connected the multiple first vias, such that the first heat dissipation structure is connected as a first S-shaped structure;
  wherein when the first S-shaped structure is turned on, heat in the first N-type deep doped regions and the first P-type deep doped regions flows from a side of each of the first N-type deep doped regions and the first P-type deep doped regions close to the device area to its other side away from the device area.

In some embodiments, the first N-type deep doped regions and the first P-type deep doped regions are rectangular, and in a rectangle, a side not adjacent to the device area is greater than a side adjacent to the device area.

In some embodiments, a distance between the device area and the first heat dissipation structure ranges from 10 microns to 20 microns.

In some embodiments, a shallow trench isolation is formed between the device area and the first heat dissipation structure.

In some embodiments, the device further comprises one or more second heat dissipation structures at a side of the first heat dissipation structure away from the device area, and the second heat dissipation structure comprises:
  multiple second N-type deep doped regions and multiple second P-type deep doped regions, the multiple second N-type deep doped regions and the multiple second P-type deep doped regions are arranged alternately in a row direction and in a column direction, respectively;
  first polysilicon gates on each of the second N-type deep doped regions, the first polysilicon gates are N-type deep doped and there is no gate oxide layer between the first polysilicon gates and the second N-type deep doped regions;
  second polysilicon gates on each of the second P-type deep doped region, the second polysilicon gates are P-type deep doped and there is no gate oxide layer between the second polysilicon gates and the second P-type deep doped regions;
  multiple second vias on each of the first polysilicon gates and each of the second polysilicon gates; and
  second metal interconnect layers connected to the multiple second vias, such that the second heat dissipation structure is connected as a second S-shaped structure;
  wherein when the second S-shaped structure is turned on, heat in the second N-type deep doped regions flows to the first polysilicon gates, and heat in the second P-type deep doped regions flows to the second polysilicon gates.

In some embodiments, a distance between the second heat dissipation structure and the first heat dissipation structure ranges from 10 microns to 20 microns.

In another aspect of the present application, a method for manufacturing an integrated cooling device based on the Peltier effect is provided, the method comprises:
  forming multiple first N-type wells and multiple first P-type wells which are alternately arranged on one side of a device area in a semiconductor substrate;
  forming first N-type deep doped regions in the first N-type wells;
  forming first P-type deep doped regions in the first P-type wells;
  forming first vias on both ends of each of the first N-type deep doped regions and each of the first P-type deep doped regions;
  forming first metal interconnect layers connected to the multiple first vias, such that the first N-type deep doped regions and the first P-type deep doped regions are connected as an S-shaped first heat dissipation structure;
  wherein when the S-shaped first heat dissipation structure is turned on, heat in the first N-type deep doped regions and the first P-type deep doped regions flows from a side of each of the first N-type deep doped regions and the first P-type deep doped regions close to the device area to its other side away from the device area.

In some embodiments, a distance between the device area and the first heat dissipation structure ranges from 10 microns to 20 microns.

In some embodiments, the method further comprises:

forming multiple second N-type wells and multiple second P-type wells on a side of the first heat dissipation structure away from the device area in the semiconductor substrate, and the multiple N-type wells and the multiple P-type wells are arranged alternately in row direction and in column direction, respectively;

forming polysilicon gates on each of the second N-type wells and each of the second P-type wells, and there is no gate oxide layer between the polysilicon gates and the semiconductor substrate;

forming second N-type deep doped regions in each of the second N-type wells and the polysilicon gates on each of the second N-type wells are doped as N-type deep doped first polysilicon gates;

forming second P-type deep doped region in each of the second P-type wells and the polysilicon gates on each of the second P-type wells are doped as P-type deep doped second polysilicon gates;

forming multiple second vias on each of the first polysilicon gates and each of the second polysilicon gates; and forming second metal interconnect layers connected to the multiple second vias, such that the multiple second N-type deep doped regions and the multiple second P-type deep doped regions are connected as an S-shaped second heat dissipation structure;

wherein when the S-shaped second heat dissipation structure is turned on, heat in the second N-type deep doped regions flows to the first polysilicon gates, and heat in the second P-type deep doped regions flows to the second polysilicon gates.

In some embodiments, a distance between the second heat dissipation structure and the first heat dissipation structure ranges from 10 microns to 20 microns.

DETAILED DESCRIPTION

In the following description, numerous technical details are set forth in order to provide readers with a better understanding of the present application. However, those skilled in the art can understand that the technical solutions claimed in the present application can be implemented without these technical details and various changes and modifications based on the following embodiments.

In the following, several different embodiments are given according to different features of the present application. The specific elements and arrangements of the present application are for simplicity, but the present application is not limited to these embodiments. For example, the description of forming a first element on a second element may include embodiments in which the first element is in direct contact with the second element, as well as embodiments in which additional elements are formed between the first element and the second element such that the first element and the second element are indirectly contact. In addition, for the sake of simplicity, the present application is represented by repeated element symbols and/or letters in different examples, but does not mean that there is a specific relationship between the embodiments and/or structures. It is important to understand that when a layer is "on" another layer or substrate, it may mean that it is directly on the other layer or substrate, or that other layer is sandwiched between other layers or substrates.

Figure 1:
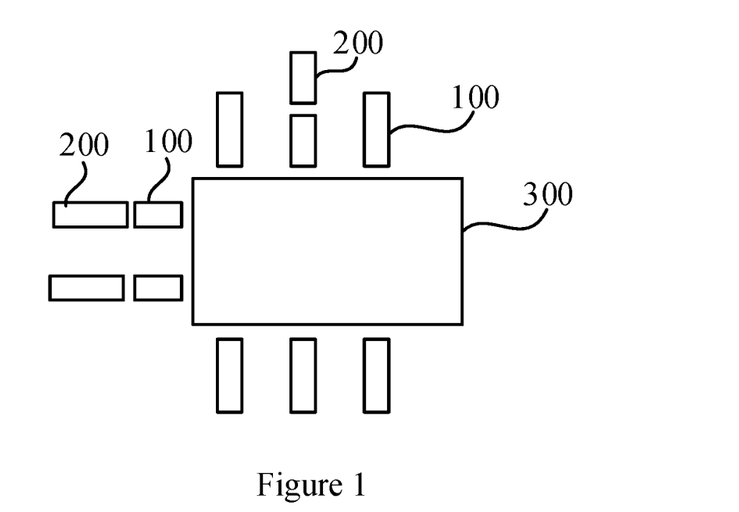
FIG. 1 shows a schematic diagram of an integrated cooling device based on the Peltier effect in an embodiment of the present application.

A first embodiment of the present application discloses an integrated cooling device based on the Peltier effect. FIG. 1 shows a schematic diagram of the integrated cooling device. The device includes one or more first heat dissipation structures 100 and one or more second heat dissipation structures 200. The one or more first heat dissipation structures 100 are located around device area 300 to horizontally transfer heat from the device area 300 to the outside. The device area 300 includes high-speed operating devices. It should be understood that the device area usually generates a large amount of heat due to high-speed operation, which causes the temperature of the device area to rise rapidly. The one or more second heat dissipation structures 200 are located at a side of the first heat dissipation structure 100 away from the device area 300, and are used to vertically transfer heat from the device area 300 to the outside. It should be understood that, in other embodiments of the present application, the cooling device may only have the first heat dissipation structure(s) 100, and not have the second heat dissipation structure 200. Similarly, in some embodiments of the present application, the cooling device may only have the second heat dissipation structure(s) 200, and not have the first heat dissipation structure 100.

In one embodiment, a distance between the device area 300 and the first heat dissipation structure 100 ranges from 10 microns to 20 microns, for example, 15 microns, 18 microns, etc.

In one embodiment, a shallow trench isolation (STI) is formed between the device area 300 and the first heat dissipation structure 100.

In one embodiment, a distance between the second heat dissipation structure 200 and the first heat dissipation structure 100 ranges from 10 microns to 20 microns, for example, 12 microns, 16 microns, etc.

Figure 2:
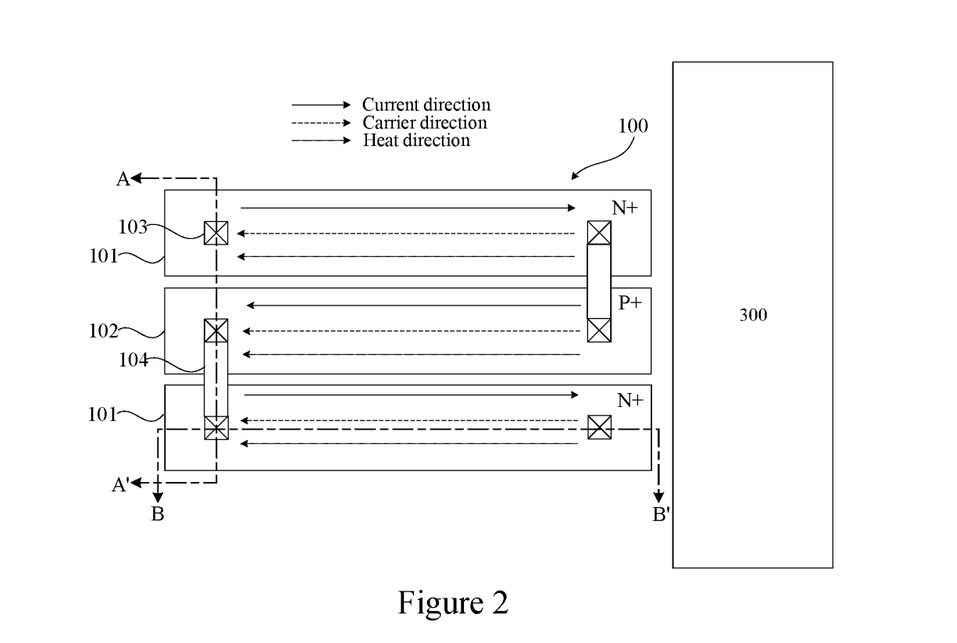
FIG. 2 shows a top view of a first heat dissipation structure according to an embodiment of the present application.
Figure 3:
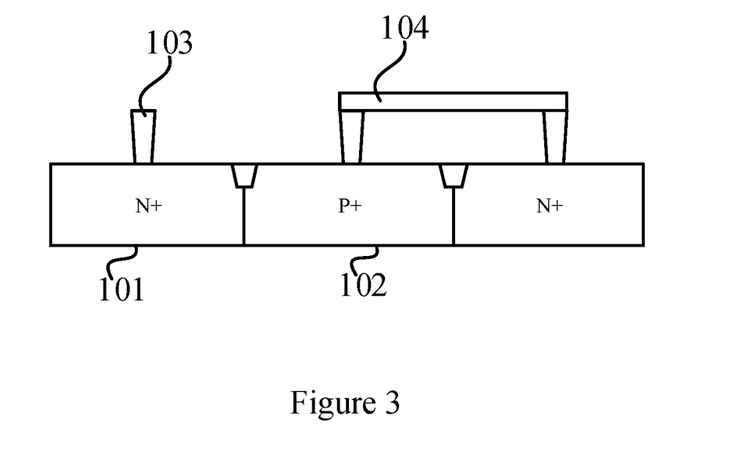
FIG. 3 shows a cross-sectional view of the first heat dissipation structure in FIG. 2 along the AA' direction in an embodiment of the present application.
Figure 4:
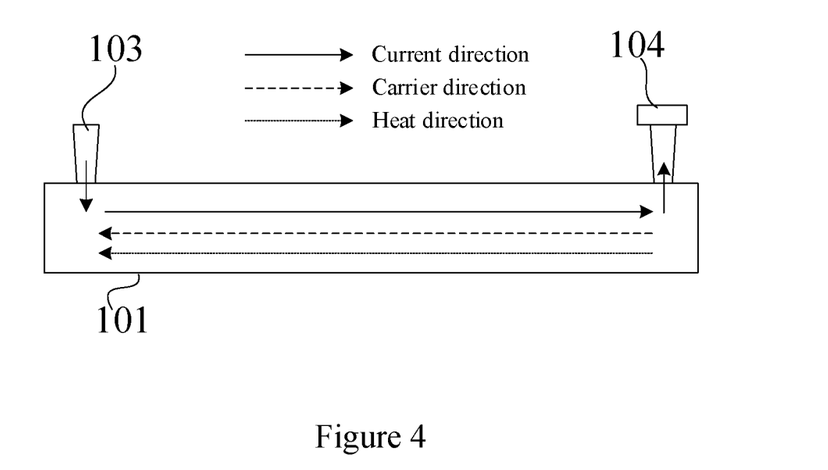
FIG. 4 shows a cross-sectional view of the first heat dissipation structure in FIG. 2 along the BB' direction in an embodiment of the present application.

FIG. 2 shows a top view of the first heat dissipation structure 100 in an embodiment of the present application. FIG. 3 is a cross-sectional view taken along the AA' direction of FIG. 2. FIG. 4 is a cross-sectional view taken along the BB' direction of FIG. 2. In conjunction with FIGS. 2 to 4, the first heat dissipation structure 100 includes: multiple first N-type deep doped regions 101, multiple first P-type deep doped regions 102, multiple first vias 103, and first metal interconnect layers 104. The multiple first N-type deep doped regions 101 and the multiple first P-type deep doped regions 102 are alternately arranged. The multiple first vias 101 are respectively located on two ends of each of the first N-type deep doped regions 101 and each of the first P-type deep doped regions 102. The first metal interconnect layers 104 connect the multiple first vias 103, such that the first heat dissipation structure 100 is connected to form a first S-shaped structure. When the first S-shaped structure is turned on, the heat in the first N-type deep doped region 101 and the first P-type deep doped region 102 flows from one side close to the device area 300 to the other side away from the device area 300.

It should be understood that the first heat dissipation structure 100 is formed in a semiconductor substrate, and the semiconductor substrate also has N-type wells and P-type wells. The N-type wells are ion implanted to form N-type deep doped regions 101, and the P-type wells are ion implanted to form P-type deep doped regions 102.

In one embodiment, the multiple first N-type deep doped regions 101 and the multiple first P-type deep doped regions 102 are rectangular, and the length of a side of the rectangle that is not adjacent to the device area 300 is greater than that of a side that is adjacent to the device area 300.

Refer to FIG. 2, when the first heat dissipation structure 100 in this embodiment is in operation, the vias 103 are connected to a power supply voltage, and current sequentially flows from the N-type deep doped region 101 to the P-type deep doped region 102, and flows to the next N-type deep doped region 101, and then sequentially circulates. The N-type deep doped region 101 is N-type doped, the carriers are electrons $e^-$, and the flow direction of the carriers $e^-$ is from the side of the N-type deep doped region 101 close to the device area 300 to its other side away from the device area 300. Then, the current flows from the N-type deep doped region 101 to the P-type deep doped region 102. The P-type deep doped region 102 is P-type doped, the carriers are holes $h^+$, and the flow direction of the carriers $h^+$ is from one side of the P-type deep doped region 102 close to the device area 300 to its other side away from the device area 300. In the heat dissipation structure 100, the flow direction of the heat is the direction of the carriers. Therefore, the flow direction of the heat is from one side of the heat dissipation structure 100 close to the device area 300 to its other side away from the device area 300, thereby achieving heat dissipation and cooling.

Figure 5:
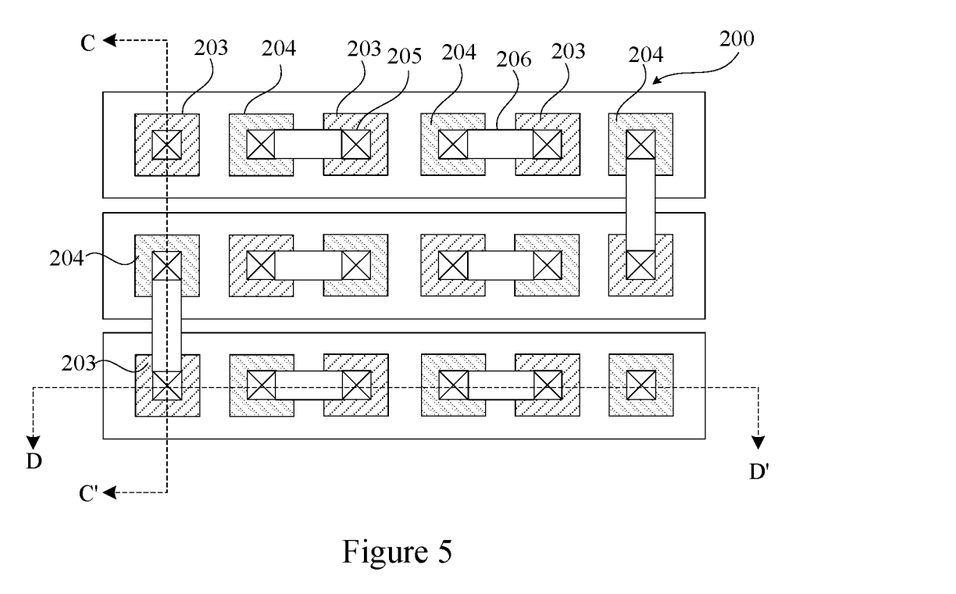
FIG. 5 shows a top view of a second heat dissipation structure in an embodiment of the present application.
Figure 6:
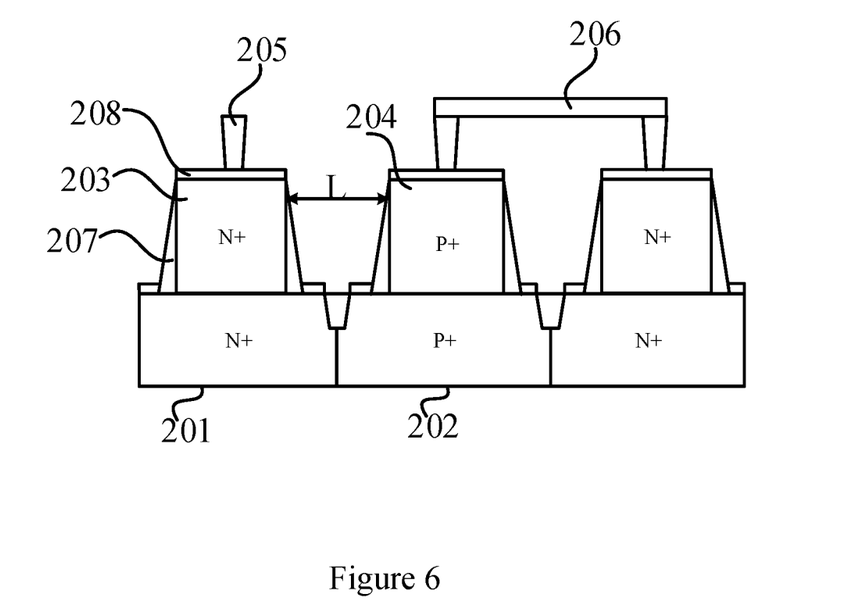
FIG. 6 shows a cross-sectional view of the second heat dissipation structure in FIG. 5 along the CC' direction in an embodiment of the present application.
Figure 7:
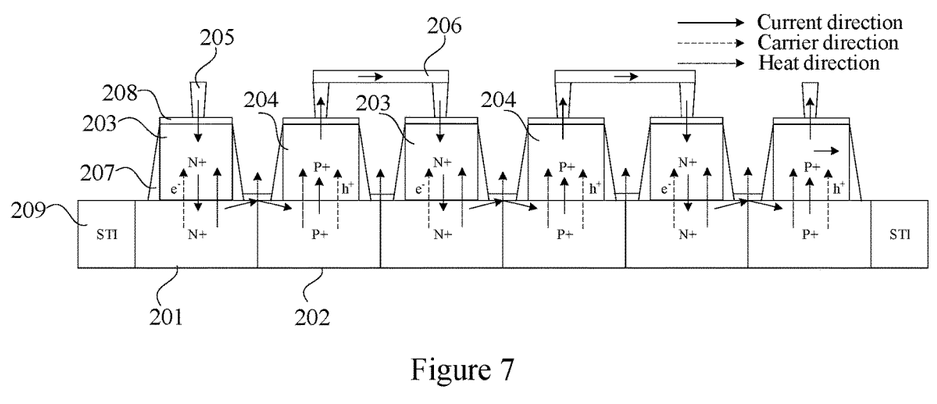
FIG. 7 shows a cross-sectional view of the second heat dissipation structure in FIG. 5 along the DD' direction in an embodiment of the present application.

FIG. 5 shows a top view of the first heat dissipation structure 200 in an embodiment of the present application. FIG. 6 is a cross-sectional view taken along the CC' direction of FIG. 5. FIG. 7 is a cross-sectional view taken along the DD' direction of FIG. 5. In conjunction with FIGS. 5 to 7, the second heat dissipation structure 200 includes: multiple second N-type deep doped regions 201, multiple P-type deep doped regions 202, first polysilicon gates 203 located on each of the second N-type deep doped regions 201, second polysilicon gates 204 located on each of the second P-type deep doped regions 202, multiple second vias 205, and second metal interconnect layers 206.

The multiple second N-type deep doped regions 201 and the multiple second P-type deep doped regions 202 are arranged alternately in row direction and in column direction, respectively. The first polysilicon gates 203 are N-type deep doped and there is no gate oxide layer between the first polysilicon gates 203 and the second N-type deep doped regions 201. The second polysilicon gates 204 are P-type deep doped and there is no gate oxide layer between the second polysilicon gates 204 and the second P-type deep doped region 202. The multiple second vias 205 are respectively located on each of the first polysilicon gates 203 and each of the second polysilicon gates 204. The second metal interconnect layers 206 connects the multiple second vias 205, such that the second heat dissipation structure 200 is connected to form a second S-shaped structure. When the second S-shaped structure is turned on, heat in the second N-type deep doped regions flows to the first polysilicon gates, and heat in the second P-type deep doped regions flows to the second polysilicon gates.

Refer to FIG. 7, when the second heat dissipation structure 200 in this embodiment is in operation, the vias 205 are connected to a power supply voltage, and current sequentially flows through the first polysilicon gate 203, the N-type deep doped region 201, the P-type deep doped region 202 and the second polysilicon gate 204, and flows to the next first polysilicon gate 203, and sequentially circulates. The first polysilicon gates 203 and the N-type deep doped regions 201 are both N-doped, the carriers are electrons $e^-$, and the flow direction of the carriers $e^-$ is from the N-type deep doped region 201 to the first polysilicon gate 203. Then, the current flows from the N-type deep doped region 201 to the P-type deep doped region 202, and then from the P-type deep doped region 202 to the second polysilicon gate 204. The P-type deep doped regions 202 and the second polysilicon gates 204 are both P-type doped, the carriers are holes $h^+$, and the flow direction of the carriers $h^+$ is from the P-type deep doped region 202 to the second polysilicon gate 204. Inside the heat dissipation structure 200, the flow direction of the heat is the direction of the carriers, and therefore, the flow direction of the heat is from the N-type deep doped region 201 to the first polysilicon gate 203, and then from the P-type deep doped region 202 to the second polysilicon gate 204, that is, from the inside of the heat dissipation structure to the surface, thereby achieving heat dissipation and cooling.

According to the found data of commercial semiconductor cooling chips, a chip with an area of about 8 mm×8 mm can have a temperature difference of 67° C. between the two terminals at a current of 2.5 A and a voltage of 0.85V. In this application, if the cross-sectional length of the first heat dissipation structure is 1000 um and the thickness is 0.3 um, calculated by area, only a current of 0.011 mA is needed to achieve the effect of cooling chip, and the required power is less than 0.01 mW. It has the effect of lowering the junction temperature of key modules with negligible power consumption.

Figure 8:
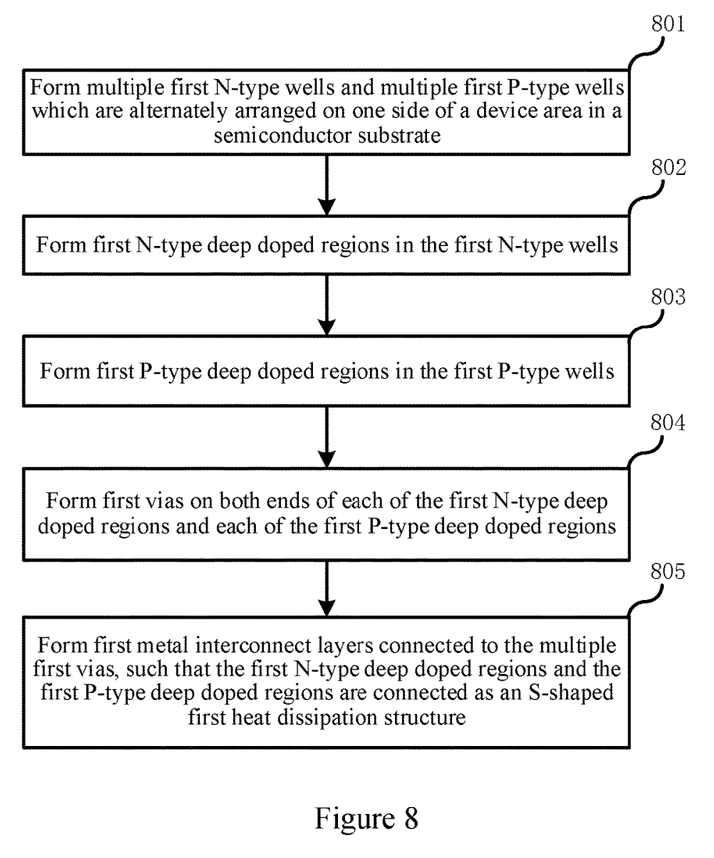
FIG. 8 shows a flowchart of a method for manufacturing an integrated cooling device based on the Peltier effect in an embodiment of the present application.

A second embodiment of this application discloses a method for manufacturing an integrated cooling device based on the Peltier effect. FIG. 8 shows a flow chart of the method for manufacturing an integrated cooling device based on the Peltier effect, and the method includes the following steps:

In step 801, as shown in FIG. 2, multiple first N-type wells (not shown) and multiple first P-type wells (not shown) arranged alternately are formed on one side of the device area 300 in the semiconductor substrate (not shown). It should be understood that the device area 300 may include a CMOS device(s), and the CMOS device and the wells may be formed using a standard CMOS process.

In step 802, first N-type deep doped regions 101 as shown in FIG. 2 are formed in the first N-type wells.

In step 803, first p-type deep doped regions 102 as shown in FIG. 2 are formed in the first P-type wells.

In step 804, first vias 103 are formed on both ends of each of the first N-type deep doped regions 101 and each of the first P-type deep doped regions 102.

In step 805, first metal interconnect layers 104 connected to the multiple first vias are formed, such that the first N-type deep doped regions 101 and the first P-type deep doped regions 102 are connected as an S-shaped first heat dissipation structure 100.

Figure 9:
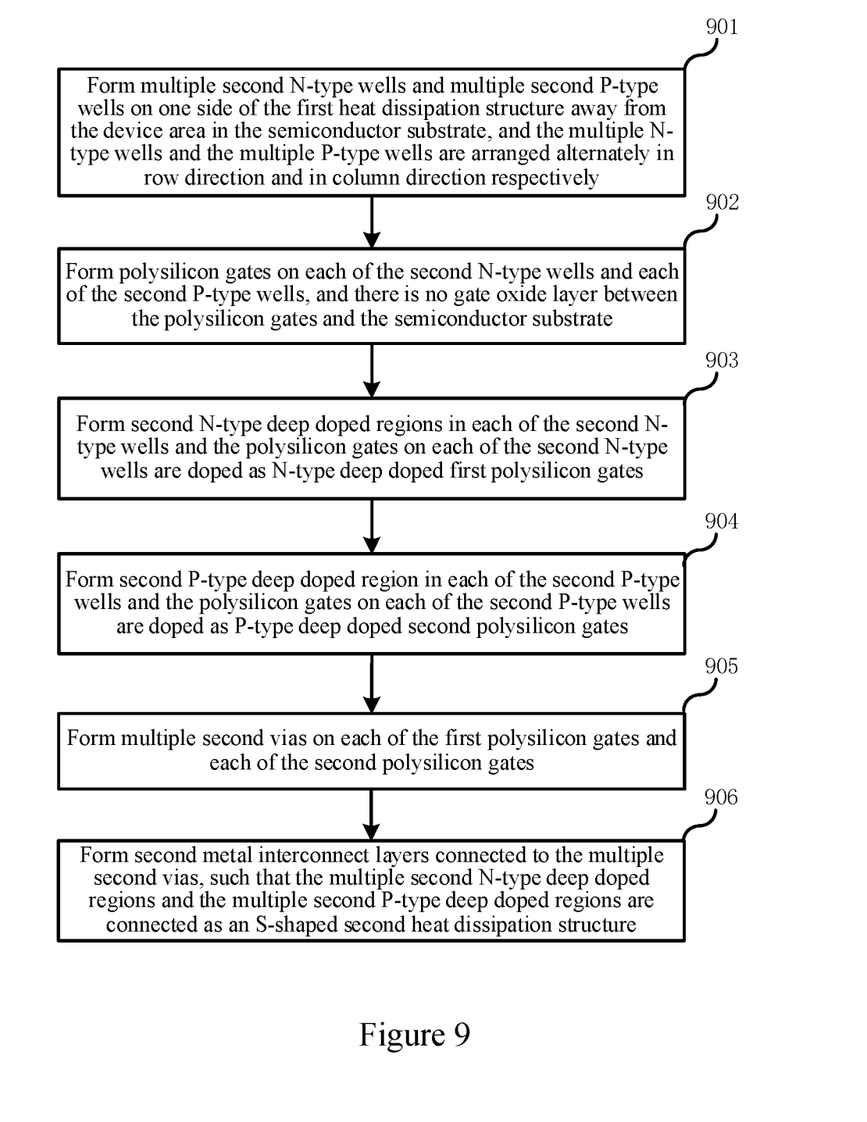
FIG. 9 shows a flowchart of a method for manufacturing a second heat dissipation structure in an embodiment of the present application.

In one embodiment, the integrated cooling device based on the Peltier effect further includes a second heat dissipation structure, and the method further includes manufacturing the second heat dissipation structure 200. Refer to FIG. 9, the method includes the following steps:

In step 901, as shown in FIG. 5, multiple second N-type wells (not shown) and multiple second P-type wells (not shown) are formed on one side of the semiconductor substrate (not shown) away from the device area. The multiple N-type wells and multiple P-type wells are arranged alternately in row direction and in column direction, respectively. It should be understood that both the first heat dissipation structure and the second heat dissipation structure may adopt standard CMOS processes, that is, the second N-type wells may be formed in one step as the first N-type wells, and the second P-type wells may be formed in one step as the first P-type wells.

In step 902, polysilicon gates are formed on each of the second N-type wells and each of the second P-type wells, and there is no gate oxide layer between the polysilicon gates and the semiconductor substrate. It should be understood that these polysilicon gates in the cooling device and the polysilicon gates in the device area are formed in one step, and there is a gate oxide layer between the polysilicon gates in the device area and the semiconductor substrate.

In step 903, second N-type deep doped regions are formed in each of the second N-type wells, and the polysilicon gates on each of the second N-type wells are doped as N-type deep doped first polysilicon gates 203.

In step 904, second P-type deep doped regions are formed in each of the second P-type wells, and the polysilicon gates on each of the second P-type wells are doped as P-type deep doped second polysilicon gates 204.

In step 905, second vias 205 are formed on each of the first polysilicon gates 203 and each of the second polysilicon gates 204.

In step 906, second metal interconnect layers 206 connected the multiple vias 205 are formed, such that the multiple second N-type deep doped regions and the multiple second P-type deep doped regions are connected as an S-shaped second heat dissipation structure.

When the second heat dissipation structure is turned on, heat in the second N-type deep doped regions flows to the first polysilicon gates, and heat in the second P-type deep doped regions flows to the second polysilicon gates.

The first embodiment is a product embodiment corresponding to the present embodiment, and the technical details in the first embodiment can be applied to the present embodiment, and the technical details in the present embodiment can also be applied to the first embodiment.

In the implementations of this application, the heat in the first heat dissipation structure flows outward from the high-temperature working module in a horizontal direction, so as to reduce the junction temperature of the high-temperature working module and ensure its normal operation and reliability. The optional second heat dissipation structure further dissipates the heat conducted by the first heat dissipation structure in a vertical direction, thereby improving the overall heat dissipation efficiency. Because the Seebeck coefficient of N+/P+ of semiconductor materials is relatively large, which is about 30 times larger than that of metal materials, only 1/30 of the current is needed to achieve the same effect as metal-based Peltier devices.

When only the first heat dissipation structure is used in the present application, compared with the existing CMOS process, only the pattern design in the layout needs to be modified in the polysilicon patterning process and the P-type and N-type ion implantation processes, and no additional photolithography process needs to be added, which is fully compatible with the existing CMOS processes, does not introduce special materials and processes, and has full feasibility. When the first heat dissipation structure and the second heat dissipation structure are both used, the present application only needs to add one photolithography and etching process to remove the gate oxide layer between the polysilicon gates and the semiconductor substrate, which can further improve the overall heat dissipation effect.

It should be noted that in this specification of the application, relational terms such as the first and second, and so on are only configured to distinguish one entity or operation from another entity or operation, and do not necessarily require or imply any such actual relationship or order between these entities or operations. Furthermore, the term "comprises" or "comprising" or "includes" or any other variations thereof is intended to encompass a non-exclusive inclusion, such that a process, method, article, or device that comprises a plurality of elements includes not only those elements but also other elements, or elements that are inherent to such a process, method, item, or device. Without more restrictions, the element defined by the phrase "comprise(s) a/an" does not exclude that there are other identical elements in the process, method, item or device that includes the element. In this specification of the application, if it is mentioned that an action is performed according to an element, it means the meaning of performing the action at least according to the element, and includes two cases: the action is performed only on the basis of the element, and the action is performed based on the element and other elements. Multiple, repeatedly, various, etc., expressions include 2, twice, 2 types, and 2 or more, twice or more, and 2 types or more types.

All documents mentioned in this specification are considered to be included in the disclosure of this application as a whole, so that they can be used as a basis for modification when necessary. In addition, it should be understood that the above descriptions are only preferred embodiments of this specification, and are not intended to limit the protection scope of this specification. Any modification, equivalent replacement, improvement, etc. made within the spirit and principle of one or more embodiments of this specification should be included in the protection scope of one or more embodiments of this specification.

In some cases, the actions or steps described in the claims can be performed in a different order than in the embodiments and still achieve desired results. In addition, the processes depicted in the drawings do not necessarily require the specific order or sequential order shown in order to achieve the desired results.

What is claimed is:

1. An integrated cooling device based on a Peltier effect, comprising:
   one or more first heat dissipation structures around a device area, and each of the one or more first heat dissipation structures comprises:
   multiple first N-type doped regions and multiple first P-type doped regions arranged alternately;

multiple first vias on both ends of each of the first N-type doped regions and each of the first P-type doped regions; and first metal interconnect layers connecting the multiple first vias, such that each of the one or more first heat dissipation structures is connected as a first S-shaped heat dissipation structure;

wherein when the first S-shaped heat dissipation structure is turned on, heat in the first N-type doped regions and the first P-type doped regions flows from a side of each of the first N-type doped regions and the first P-type doped regions close to the device area to its other side away from the device area;

one or more second heat dissipation structures at a side of the one or more first heat dissipation structures away from the device area, and each of the one or more second heat dissipation structures comprises:

multiple second N-type doped regions and multiple second P-type doped regions, the multiple second N-type doped regions and the multiple second P-type doped regions are arranged alternately in a row direction and in a column direction, respectively;

first polysilicon gates on each of the second N-type doped regions, the first polysilicon gates are N-type doped and there is no gate oxide layer between the first polysilicon gates and the second N-type doped regions;

second polysilicon gates on each of the second P-type doped region, the second polysilicon gates are P-type doped and there is no gate oxide layer between the second polysilicon gates and the second P-type doped regions; and multiple second vias on each of the first polysilicon gates and each of the second polysilicon gates; and second metal interconnect layers connecting to the multiple second vias, such that each of the one or more second heat dissipation structures is connected as a second S-shaped structure;

wherein when the second S-shaped structure is turned on, heat in the second N-type doped regions flows to the first polysilicon gates, and heat in the second P-type doped regions flows to the second polysilicon gates.

2. The integrated cooling device based on the Peltier effect of claim 1, wherein the first N-type doped regions and the first P-type doped regions are rectangular, and in a rectangle, a side not adjacent to the device area is greater than a side adjacent to the device area.

3. The integrated cooling device based on the Peltier effect of claim 1, wherein a distance between the device area and the one or more first heat dissipation structures ranges from 10 microns to 20 microns.

4. The integrated cooling device based on the Peltier effect of claim 1, wherein a shallow trench isolation is formed between the device area and the one or more first heat dissipation structures.

5. The integrated cooling device based on the Peltier effect of claim 1, wherein a distance between the one or more second heat dissipation structures and the one or more first heat dissipation structures ranges from 10 microns to 20 microns.

6. A method for manufacturing the integrated cooling device based on the Peltier effect of claim 1.

7. The method of claim 6, wherein a distance between the device area and the one or more first heat dissipation structures ranges from 10 microns to 20 microns.

8. The method of claim 6, wherein a distance between the one or more second heat dissipation structures and the one or more first heat dissipation structures ranges from 10 microns to 20 microns.

\* \* \* \* \*